United States Patent

Huang (10) Patent No.: US 9,455,686 B1
(45) Date of Patent: Sep. 27, 2016

(54) WIRELESS COMMUNICATION DEVICE AND TUNABLE FILTER THEREOF

(71) Applicant: Wistron NeWeb Corp., Hsinchu (TW)

(72) Inventor: Chun-Chieh Huang, Hsinchu (TW)

(73) Assignee: Wistron NeWeb Corp., Hsinchu (TW)

(*) Notice: Subject to any disclaimer, the term of this patent is extended or adjusted under 35 U.S.C. 154(b) by 0 days.

(21) Appl. No.: 14/988,754

(22) Filed: Jan. 6, 2016

(30) Foreign Application Priority Data

Apr. 2, 2015 (TW) .............................. 104110900 A (51) Int. Cl.
*H04B 1/10* (2006.01)
*H03H 11/04* (2006.01)
*H04B 1/40* (2015.01)
*H04B 1/00* (2006.01)

(52) U.S. Cl.
CPC ............ *H03H 11/04* (2013.01); *H04B 1/0067* (2013.01); *H04B 1/40* (2013.01)

(58) Field of Classification Search
None
See application file for complete search history.

(56) References Cited

U.S. PATENT DOCUMENTS

| | | | | |
|---|---|---|---|---|
| 6,453,157 B1* | 9/2002 | Roberts | ................. | H03J 1/0008 333/176 |
| 6,472,957 B1* | 10/2002 | Dobrovolny | ......... | H03H 7/0115 333/174 |
| 6,518,859 B1* | 2/2003 | Spampinato | ......... | H03H 7/1775 333/174 |
| 6,982,614 B2* | 1/2006 | Humphrey | .............. | H03J 5/244 333/174 |
| 7,427,907 B2* | 9/2008 | Sheng | ..................... | H03J 1/005 334/15 |
| 7,501,919 B2* | 3/2009 | Sheng | ..................... | H03J 1/005 334/15 |
| 7,539,470 B2* | 5/2009 | Kim | ......................... | H03J 3/08 455/130 |
| 7,863,999 B2* | 1/2011 | Tsuzuki | ............... | H03H 7/0153 333/168 |
| 8,600,335 B2* | 12/2013 | Manetakis | ............... | H04B 1/18 333/101 |
| 8,699,977 B2* | 4/2014 | Babitch | ................ | H04B 1/0053 455/150.1 |
| 8,797,120 B2* | 8/2014 | Tsuzuki | ............... | H03H 7/0153 333/17.1 |
| 9,257,956 B2* | 2/2016 | Ricard | ................. | H03H 7/0115 |
| 2011/0241798 A1* | 10/2011 | Hong | ................... | H03H 7/0115 333/175 |
| 2012/0243640 A1* | 9/2012 | Babitch | ................ | H04B 1/0053 375/329 |
| 2014/0091881 A1* | 4/2014 | Ricard | ................. | H03H 7/0115 333/176 |

\* cited by examiner

*Primary Examiner* — Tuan A Tran
(74) *Attorney, Agent, or Firm* — Jianq Chyun IP Office (57) ABSTRACT

A wireless communication device and a tunable filter are provided. The tunable filter includes a first energy storage element, a first series resonant circuit, a second series resonant circuit, a first tunable parallel resonant circuit and a second tunable parallel resonant circuit. The first series resonant circuit and the second series resonant circuit respectively include a first capacitor and a first inductor electrically connected in series. The first tunable parallel resonant circuit and the second tunable parallel resonant circuit respectively include a variable capacitor and a second inductor electrically connected between a ground and a bias voltage. The first series resonant circuit is electrically connected between a first end of the first energy storage element and the first tunable parallel resonant circuit. The second series resonant circuit is electrically connected between a second end of the first energy storage element and the second tunable parallel resonant circuit.

20 Claims, 8 Drawing Sheets

WIRELESS COMMUNICATION DEVICE AND TUNABLE FILTER THEREOF

CROSS-REFERENCE TO RELATED APPLICATION

This application claims the priority benefit of Taiwan application serial no. 104110900, filed on Apr. 2, 2015. The entirety of the above-mentioned patent application is hereby incorporated by reference herein and made a part of this specification.

BACKGROUND OF THE INVENTION

1. Field of the Invention

The invention is related to a wireless communication device and a tunable filter thereof, and more particularly to a wireless communication device with concurrent dual-radio operation and a tunable filter thereof.

2. Description of Related Art

For the past few years, wireless local area network that meets IEEE 802.11ac communication standard utilizes concurrent dual-radio technology to increase the number of user connections. The IEEE 802.11 ac communication standard may use the band of unlicensed national information infrastructure (UNII) to perform communication. With concurrent dual-radio operation, two transceivers in a wireless communication device may simultaneously operate in an UNII-1 (5.17~5.25 GHz) band and an UNII-3 (5.735~5.815 GHz) band adjacent to each other. In addition, to prevent the wireless communication device from being affected by the interference between two bands, it is necessary to equip the wireless communication device with a filter having a steep filtering curve and high isolation.

Generally speaking, conventional technologies increase order of the filter to increase the attenuation thereof. However, as the order of the filter increases, the size of the filter increases as well. In other words, conventional filters normally increase the manufacturing cost of the wireless communication device. Besides, an operating band of the wireless communication device is normally limited by the conventional filters, thereby limiting the application of the wireless communication device.

SUMMARY OF THE INVENTION

The invention provides a wireless communication device and a tunable filter thereof. Two ends of an energy storage element are respectively connected in cascade with a series resonant circuit and a tunable parallel resonant circuit so as to form a tunable filter. Accordingly, the tunable filter can effectively reduce the manufacturing cost of the wireless communication device and increase the applicability of the wireless communication device.

In the invention, the tunable filter has an input end and an output end and includes a first energy storage element, a first series resonant circuit, a second series resonant circuit, a first tunable parallel resonant circuit and a second tunable parallel resonant circuit. The first energy storage element is electrically connected between the input end and the output end. The first series resonant circuit and the second series resonant circuit respectively include a first capacitor and a first inductor electrically connected in series. The first tunable parallel resonant circuit and the second tunable parallel resonant circuit respectively include a variable capacitor and a second inductor electrically connected between a ground and a bias voltage. A connection node is located between the variable capacitor and the second inductor, and one end of the second inductor is configured to receive the bias voltage for adjusting a capacitance of the variable capacitor. The first series resonant circuit is electrically connected between a first end of the first energy storage element and the connection node of the first tunable parallel resonant circuit. The second series resonant circuit is electrically connected between a second end of the first energy storage element and the connection node of the second tunable parallel resonant circuit.

In the invention, the wireless communication device includes a first transceiver, a second transceiver, a first tunable filter and a first filter. The first transceiver is electrically coupled to a first antenna. The second transceiver is electrically coupled to a second antenna. The first tunable filter is disposed between the first transceiver and the first antenna, and the first tunable filter is a first tunable filter. The first filter is disposed between the second transceiver and the second antenna. The first tunable filter has an input end and an output end and includes a first energy storage element, a first series resonant circuit, a second series resonant circuit, a first tunable parallel resonant circuit and a second tunable parallel resonant circuit. The first energy storage element is electrically connected between the input end and the output end of the first tunable filter. The first series resonant circuit and the second series resonant circuit respectively include a first capacitor and a first inductor electrically connected in series. The first tunable parallel resonant circuit and the second tunable parallel resonant circuit respectively include a first variable capacitor and a second inductor electrically connected between a ground and a first bias voltage. A connection node is located between the first variable capacitor and the second inductor, and one end of the second inductor is configured to receive the bias voltage for adjusting a capacitance of the first variable capacitor. The first series resonant circuit is electrically connected between a first end of the first energy storage element and the connection node of the first tunable parallel resonant circuit. The second series resonant circuit is electrically connected between a second end of the first energy storage element and the connection node of the second tunable parallel resonant circuit.

Based on the above, in the invention, the first end of the first energy storage element is connected in cascade with the first series resonant circuit and the first tunable parallel resonant circuit, and the second end of the first energy storage element is connected in cascade with the second series resonant circuit and the second tunable parallel resonant circuit. Accordingly, the tunable filter can effectively reduce the manufacturing cost of the wireless communication device and increase the applicability of the wireless communication device.

In order to make the aforementioned features and advantages of the invention more comprehensible, embodiments accompanying figures are described in detail below.

DESCRIPTION OF EMBODIMENTS

Figure 1:
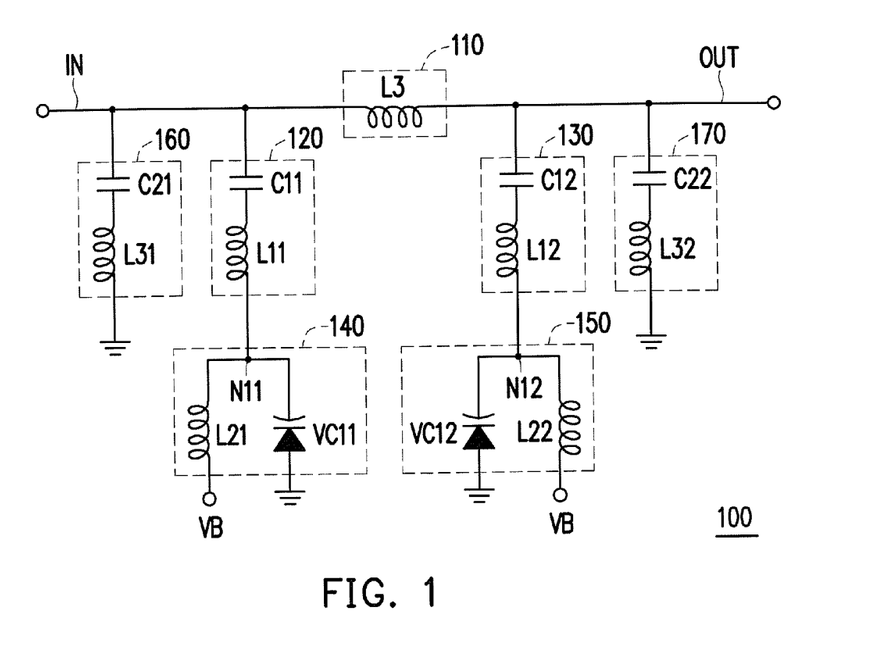
FIG. 1 is a schematic view illustrating a circuit of a tunable filter according to an embodiment of the invention.

FIG. 1 is a schematic view illustrating a circuit of a tunable filter according to an embodiment of the invention. As shown in FIG. 1, a tunable filter 100 has an input end IN and an output end OUT. The tunable filter 100 includes an energy storage element 110, series resonant circuits 120 and 130, and tunable parallel resonant circuits 140 and 150. The energy storage element 110 is electrically connected between the input end IN and the output end OUT. The series resonant circuits 120 and 130 respectively include a capacitor and an inductor that are electrically connected in series. For example, the series resonant circuit 120 includes a capacitor C11 and an inductor L11 that are electrically connected in series. The series resonant circuit 130 includes a capacitor C12 and an inductor L12 that are electrically connected in series. In another embodiment of the invention, the sequence of serial connection of the capacitor and the inductor in each of the series resonant circuits 120 and 130 may be switched to be any sequence, and the impedance of the capacitor and the inductor in each of the series resonant circuits 120 and 130 may be adjusted, such that the tunable filter 100 has the same frequency response.

The tunable parallel resonant circuits 140 and 150 respectively include a variable capacitor and an inductor that are connected between a ground and a bias voltage, and a connection node is located between the variable capacitor and the inductor. For example, the tunable parallel resonant circuit 140 includes a variable capacitor VC11 and an inductor L21 that are connected between the ground and the bias voltage VB, and a connection node N11 is located between the variable capacitor VC11 and the inductor L21. Moreover, the tunable parallel resonant circuit 150 includes a variable capacitor VC12 and an inductor L22 that are connected between the ground and the bias voltage VB, and a connection node N12 is located between the variable capacitor VC12 and the inductor L22. The variable capacitors VC11 and VC12 may be, for example, a varactor diode.

Specifically, the series resonant circuit 120 is electrically connected between a first end of the energy storage element 110 and the connection node N11 of the tunable parallel resonant circuit 140. The series resonant circuit 130 is electrically connected between a second end of the energy storage element 110 and the connection node N12 of the tunable parallel resonant circuit 150. Accordingly, the tunable filter 100 having a pass band and a stop band can be formed. Furthermore, the bias voltage VB is configured to adjust a capacitance of the variable capacitor VC11 and a capacitance of the variable capacitor VC12, thereby changing the center frequency of the pass band and the center frequency of the stop band.

For example, in the embodiment illustrated by FIG. 1, the energy storage element 110 may be, for example, an inductor L3. In addition, a first end of the inductor L3 is electrically connected to the input end IN and the capacitor C11 of the series resonant circuit 120. Moreover, the second end of the inductor L3 is electrically connected to the output end OUT and the capacitor C12 of the series resonant circuit 130. The inductor L11 of the series resonant circuit 120 is electrically connected to the connection node N11 of the tunable parallel resonant circuit 140. The inductor L12 of the series resonant circuit 130 is electrically connected to the connection node N12 of the tunable parallel resonant circuit 150. Accordingly, the energy storage element 110, the series resonant circuits 120 and 130 as well as the tunable parallel resonant circuits 140 and 150 may form a 5-order low-pass tunable filter.

Figure 2:
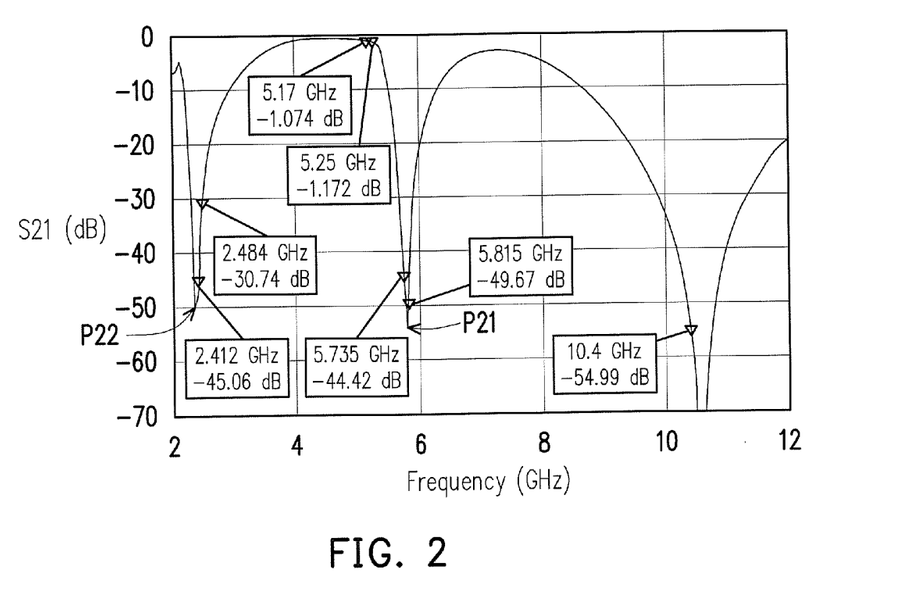
FIG. 2 is a schematic view describing frequency response of the tunable filter in FIG. 1 according to an embodiment of the invention.

FIG. 2 is a schematic view describing frequency response of the tunable filter in FIG. 1 according to an embodiment of the invention. As shown in FIG. 2, when the bias voltage VB is adjusted to a predetermined level, the variable capacitors VC11 and VC12 have a predetermined capacitance respectively. In this case, the pass band of the tunable filter 100 covers 5.17~5.25 GHz (i.e. UNII-1 band), and the stop band of the tunable filter 100 covers 5.735~5.815 GHz (i.e. UNII-3 band). In addition, the pass band of the tunable filter 100 is very flat, and the tunable filter 100 has rapid attenuation in a transition band. Therefore, compared with conventional filters, the tunable filter 100 may be formed with good performance without increasing the order of the tunable filter 100, thereby reducing the manufacturing cost of the wireless communication device and facilitating minimization of the wireless communication device.

Figure 3:
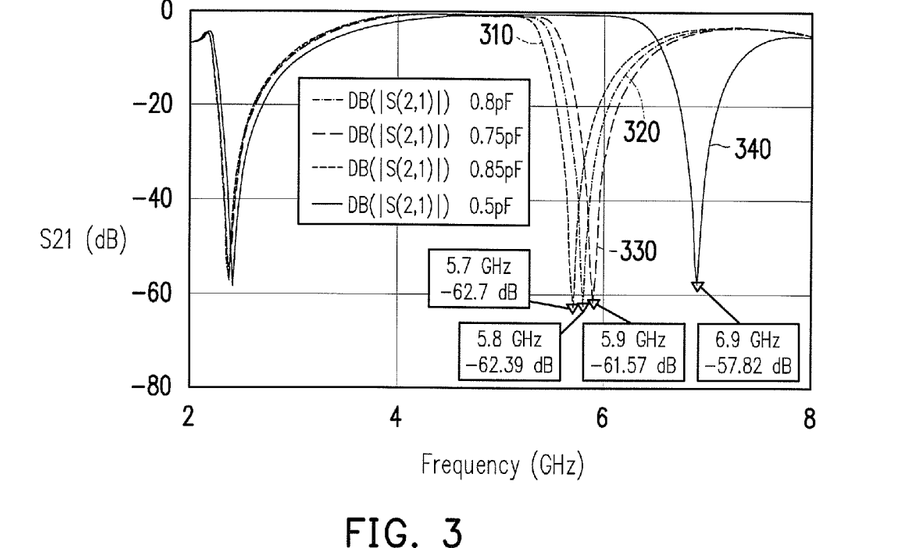
FIG. 3 is a schematic view describing frequency response of the tunable filter in FIG. 1 according to another embodiment of the invention.

FIG. 3 is a schematic view describing frequency response of the tunable filter in FIG. 1 according to another embodiment of the invention. As the bias voltage VB increases, the capacitances of the variable capacitor VC11 and VC12 are tuned to 0.85 pF, 0.8 pF, 0.75 pF and 0.5 pF, respectively. As shown by a curve 310 in FIG. 3, when the capacitances of the variable capacitor VC11 and VC12 are 0.85 pF, the insertion loss of the tunable filter 100 at 5.7 GHz is −62.7 dB. As shown by a curve 320 in FIG. 3, when the capacitances of the variable capacitor VC11 and VC12 are 0.8 pF, the insertion loss of the tunable filter 100 at 5.8 GHz is −62.39 dB. As shown by a curve 330 in FIG. 3, when the capacitances of the variable capacitor VC11 and VC12 are 0.75 pF, the insertion loss of the tunable filter 100 at 5.9 GHz is −61.57 dB. As shown by a curve 340 in FIG. 3, when the capacitances of the variable capacitor VC11 and VC12 are 0.5 pF, the insertion loss of the tunable filter 100 at 6.9 GHz is −57.82 dB. In other words, as the bias voltage VB increases, the capacitances of the variable capacitor VC11 and VC12 decreases correspondingly, and the pass band and the stop band of the tunable filter 100 may be shifted to a higher frequency range.

In other words, the frequency response of the tunable filter 100 is changed by varying the capacitances of the variable capacitor VC11 and VC12 according to the bias voltage VB, thereby selecting a desired pass band and a desired stop band of the tunable filter 100. Therefore, when the tunable filter 100 is applied in the wireless communication device, an operating band of the wireless communication device may be adjusted through the bias voltage VB, thereby increase the applicability of the wireless communication device.

It should be noted that, as shown in FIG. 2, the characteristic curve of the tunable filter 100 includes two turning points P21 and P22. Accordingly, the tunable filter 100 not only can attenuate the signal in the stop band, but also can attenuate the signal in a filter band (i.e. 2.412~2.484 GHz). Moreover, another embodiment of the invention may increase another filter band to filter second order harmonic distortion by adding a series resonant circuit in both ends of the filter depending on the needs of the design. For example, as shown in FIG. 1, the tunable filter 100 further includes series resonant circuits 160 and 170, wherein the series resonant circuit 160 is electrically connected to the input end IN, and the series resonant circuit 170 is electrically connected to the output end OUT.

The series resonant circuit 160 includes a capacitor C21 and an inductor L31, and the series resonant circuit 170 includes a capacitor C22 and an inductor L32. The capacitor C21 and the inductor L31 are sequentially connected in series between the input end IN and the ground. The sequence of serial connection of the capacitor C21 and the inductor L31 may be switched to be any sequence. Likewise, the capacitor C22 and the inductor L32 are sequentially connected in series between the output end OUT and the ground. The sequence of serial connection of the capacitor C22 and the inductor L32 may be switched to be any sequence. Accordingly, the tunable filter 100 may increase another filter band through the series resonant circuits 160 and 170. For example, as shown in FIG. 2, the tunable filter 100 may further generate another filter band through the series resonant circuits 160 and 170 to filter the second order harmonic distortion at 10.4 GHz.

Figure 4:
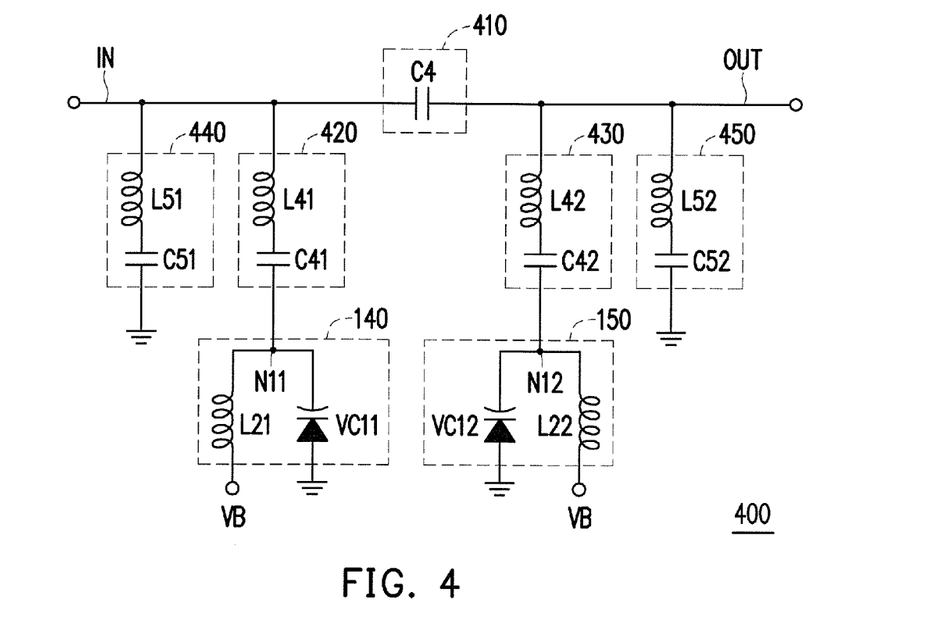
FIG. 4 is a schematic view illustrating a circuit of a tunable filter according to another embodiment of the invention.

Although the embodiment described by FIG. 1 exemplifies types of the tunable filter, it should not be construed as a limitation to the invention. For example, FIG. 4 is a schematic view illustrating a circuit of a tunable filter according to another embodiment of the invention. In the embodiment described by FIG. 4, an energy storage element 410 may be, for example, a capacitor C4. In addition, a first end of the capacitor C4 is electrically connected to the input end IN and an inductor L41 of a series resonant circuit 420. A second end of the capacitor C4 is electrically connected to the output end OUT and an inductor L42 of a series resonant circuit 430. A capacitor C41 of a series resonant circuit 420 is electrically connected to the connection node N11 of the tunable parallel resonant circuit 140. A capacitor C42 of a series resonant circuit 430 is electrically connected to the connection node N12 of the tunable parallel resonant circuit 150.

An inductor L51 and a capacitor C51 of a series resonant circuit 440 are sequentially connected in series between the input end IN and the ground. An inductor L52 and a capacitor C52 of a series resonant circuit 450 are sequentially connected in series between the output end OUT and the ground. Accordingly, the energy storage element 410, the series resonant circuits 420 and 430 as well as the tunable parallel resonant circuits 140 and 150 may form a 5-order high-pass tunable filter, and the series resonant circuits 440 and 450 are configured to increase another filter band to filter second order harmonic distortion.

Figure 5:
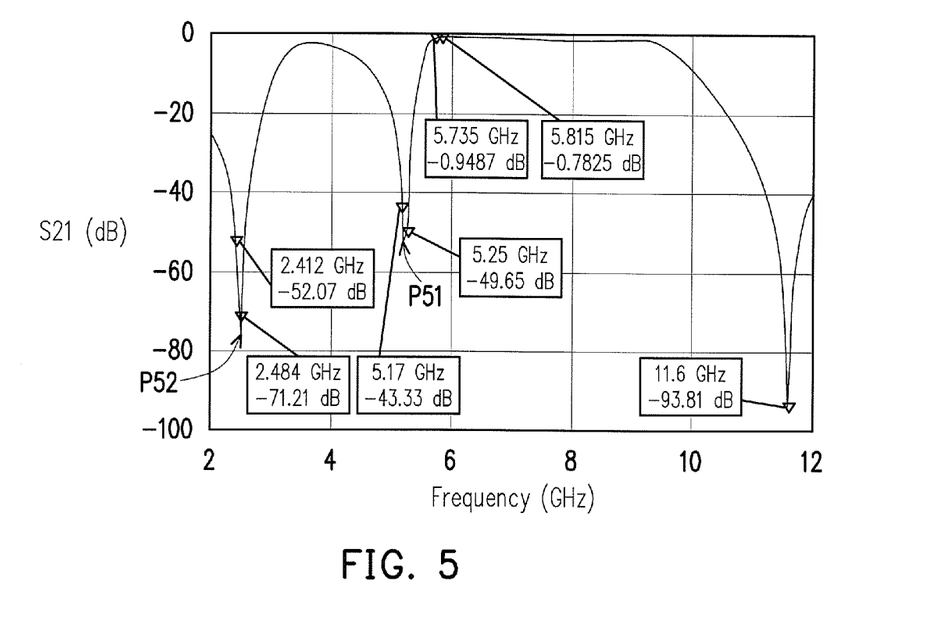
FIG. 5 is a schematic view describing frequency response of the tunable filter in FIG. 4 according to an embodiment of the invention.

FIG. 5 is a schematic view describing frequency response of the tunable filter in FIG. 4 according to an embodiment of the invention. As shown in FIG. 5, when the bias voltage VB is adjusted to a predetermined level, the variable capacitors VC11 and VC12 have a predetermined capacitance respectively. A pass band of a tunable filter 400 covers 5.735~5.815 GHz (i.e., UNII-3 band), and a stop band of the tunable filter 400 covers 5.17~5.25 GHz (i.e., UNII-1 band). Furthermore, the characteristic curve of the tunable filter 400 includes two turning points P51 and P52. Therefore, the tunable filter 400 not only can attenuate the signal in the stop band, but also can attenuate the signal in a filter band (i.e. 2.412~2.484 GHz). In addition, the tunable filter 400 may filter the second order harmonic distortion at 11.6 GHz through the series resonant circuits 440 and 450.

Figure 6:
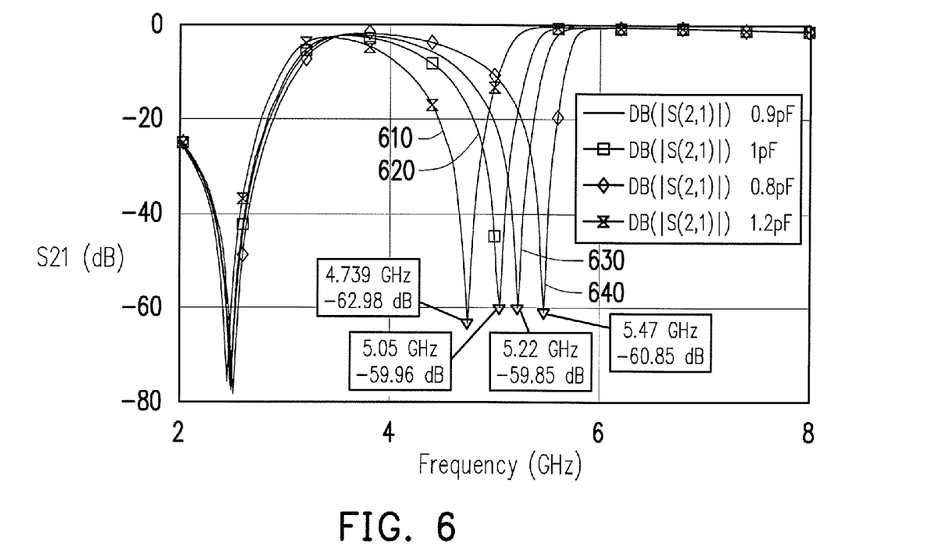
FIG. 6 is a schematic view describing frequency response of the tunable filter in FIG. 4 according to another embodiment of the invention.

FIG. 6 is a schematic view describing frequency response of the tunable filter in FIG. 4 according to another embodiment of the invention. As the bias voltage VB decreases, the capacitances of the variable capacitor VC11 and VC12 are tuned to 0.8 pF, 0.9 pF, 1 pF and 1.2 pF, respectively. As shown by a curve 610 in FIG. 6, when the capacitances of the variable capacitor VC11 and VC12 are 1.2 pF, the insertion loss of the tunable filter 400 at 4.739 GHz is −62.98 dB. As shown by a curve 620 in FIG. 6, when the capacitances of the variable capacitor VC11 and VC12 are 1 pF, the insertion loss of the tunable filter 400 at 5.05 GHz is −59.96 dB. As shown by a curve 630 in FIG. 6, when the capacitances of the variable capacitor VC11 and VC12 are 0.9 pF, the insertion loss of the tunable filter 400 at 5.22 GHz is −59.85 dB.

As shown by a curve 640 in FIG. 6, when the capacitances of the variable capacitor VC11 and VC12 are 0.8 pF, the insertion loss of the tunable filter 400 at 5.47 GHz is −60.85 dB. In other words, as the bias voltage VB decreases, the capacitances of the variable capacitor VC11 and VC12 increases correspondingly, and the pass band and the stop band of the tunable filter 400 may be shifted to a lower frequency range. Namely, the frequency response of the tunable filter 400 is changed by varying the capacitances of the variable capacitor VC11 and VC12 according to the bias voltage VB, thereby selecting a desired pass band and a desired stop band of the tunable filter 400.

Figure 7:
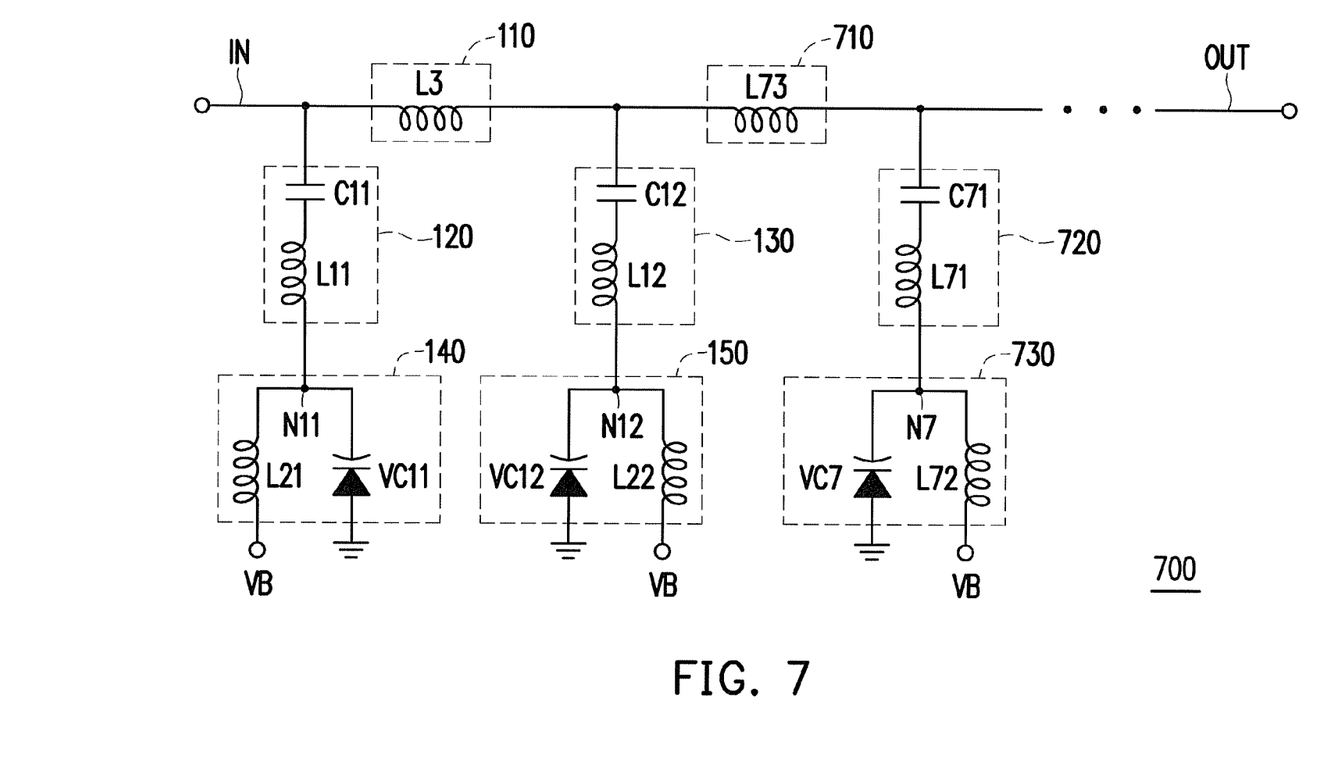
FIG. 7 is a schematic view illustrating a circuit of a tunable filter according to another embodiment of the invention.

The embodiments described by FIGS. 1 and 4 exemplify the 5-order tunable filters. Furthermore, another embodiment may increase the order of the tunable filters to 8, 11, 14, 17 etc. orders depending on the needs of design. For example, FIG. 7 is a schematic view illustrating a circuit of a tunable filter according to another embodiment of the invention. Similarly to the embodiment of FIG. 1, a tunable filter 700 in FIG. 7 includes the energy storage element 110, the series resonant circuits 120 and 130, and the tunable parallel resonant circuits 140 and 150. Meanwhile, the tunable filter 700 further includes an energy storage element 710, a series resonant circuit 720 and a tunable parallel resonant circuit 730. A first end of the energy storage element 710 is electrically connected to the energy storage element 110, and a second end of the energy storage element 710 is electrically connected to the output end OUT. The energy storage element 710 may be, for example, an inductor L73.

Like the series resonant circuit 120, the series resonant circuit 720 includes a capacitor C71 and an inductor L71. The capacitor C71 and the inductor L71 are connected in series between the second end of the inductor L73 and the tunable parallel resonant circuit 730. Like the tunable parallel resonant circuit 140, the tunable parallel resonant circuit 730 includes an inductor L72 and a variable capacitor VC7. The inductor L72 and the variable capacitor VC7 are connected between the ground and the bias voltage VB, and a connection node N7 between the inductor L72 and the variable capacitor VC7 is connected to the inductor L71. Moreover, the series resonant circuit 720 and the tunable parallel resonant circuit 730 are connected in cascade. Accordingly, the energy storage element 710, the series resonant circuit 720 and the tunable parallel resonant circuit 730 may cause the order of the tunable filter 700 to be expanded to 8 orders. In other words, the tunable filter 700 in FIG. 7 may be, for example, an 8-order low-pass tunable filter. It should be noted that, in another embodiment, the energy storage element 710 may also be, for example, electrically connected between the input end IN and the energy storage element 110. That is to say, in another embodiment, the first end of the energy storage element 710 is electrically connected to the energy storage element 110, and the second end of the energy storage 710 is electrically connected to the input end IN.

Figure 8:
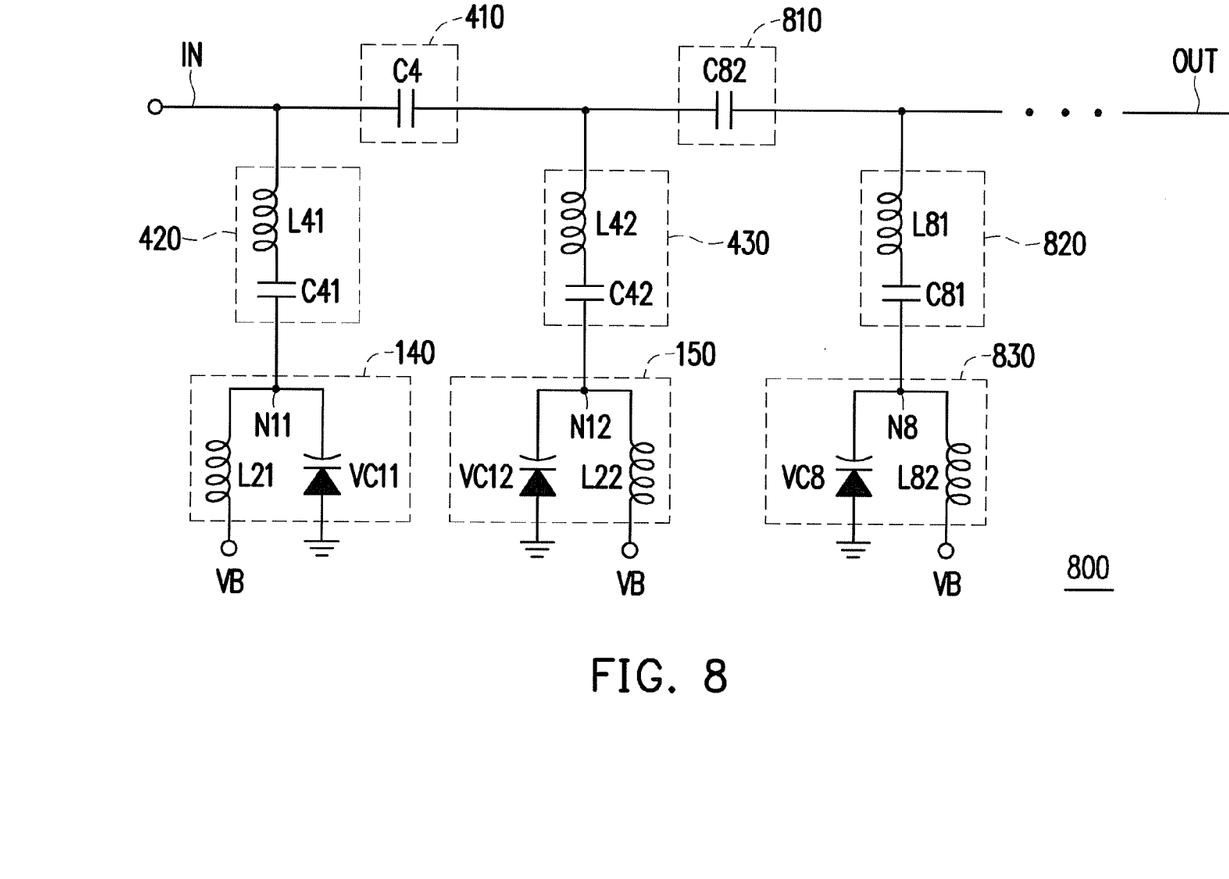
FIG. 8 is a schematic view illustrating a circuit of a tunable filter according to another embodiment of the invention.

FIG. 8 is a schematic view illustrating a circuit of a tunable filter according to another embodiment of the invention. Similarly to the embodiment of FIG. 4, a tunable filter 800 in FIG. 8 includes the energy storage element 410, the series resonant circuits 420 and 430, and the tunable parallel resonant circuits 140 and 150. Meanwhile, the tunable filter 800 further includes an energy storage element 810, a series resonant circuit 820 and a tunable parallel resonant circuit 830. The energy storage element 810 is disposed between the energy storage element 410 and the output end OUT, and the energy storage element 810 may be, for example, a capacitor C82.

The circuit structures of the series resonant circuit 820 and the series resonant circuit 420 are identical, and the circuit structures of the tunable parallel resonant circuit 830 and the tunable parallel resonant circuit 140 are identical. For instance, the series resonant circuit 820 includes an inductor L81 and a capacitor C81 that are connected in series. The tunable parallel resonant circuit 830 includes an inductor L82 and a variable capacitor VC8 that are connected between the ground and the bias voltage VB, and a connection node N8 between the inductor L82 and the variable capacitor VC8 is connected to the capacitor C81. Moreover, the series resonant circuit 820 and the tunable parallel resonant circuit 830 are connected in cascade. Accordingly, the tunable filter 800 in FIG. 8 may be, for example, an 8-order high-pass tunable filter. In another embodiment, the energy storage element 810 may also be, for example, electrically connected between the input end IN and the energy storage element 810.

Compared with conventional filters, the tunable filters 100, 400, 700 and 800 as exemplified in the above embodiments have better frequency response, and the attenuation slope is steeper as well. Accordingly, the tunable filters exemplified in the above embodiments have the characteristic of steep filter curve or high isolation, which may be applied in the wireless communication device having concurrent dual-radio operation so as to solve mutual interference between two adjacent bands in the wireless communication device.

Figure 9:
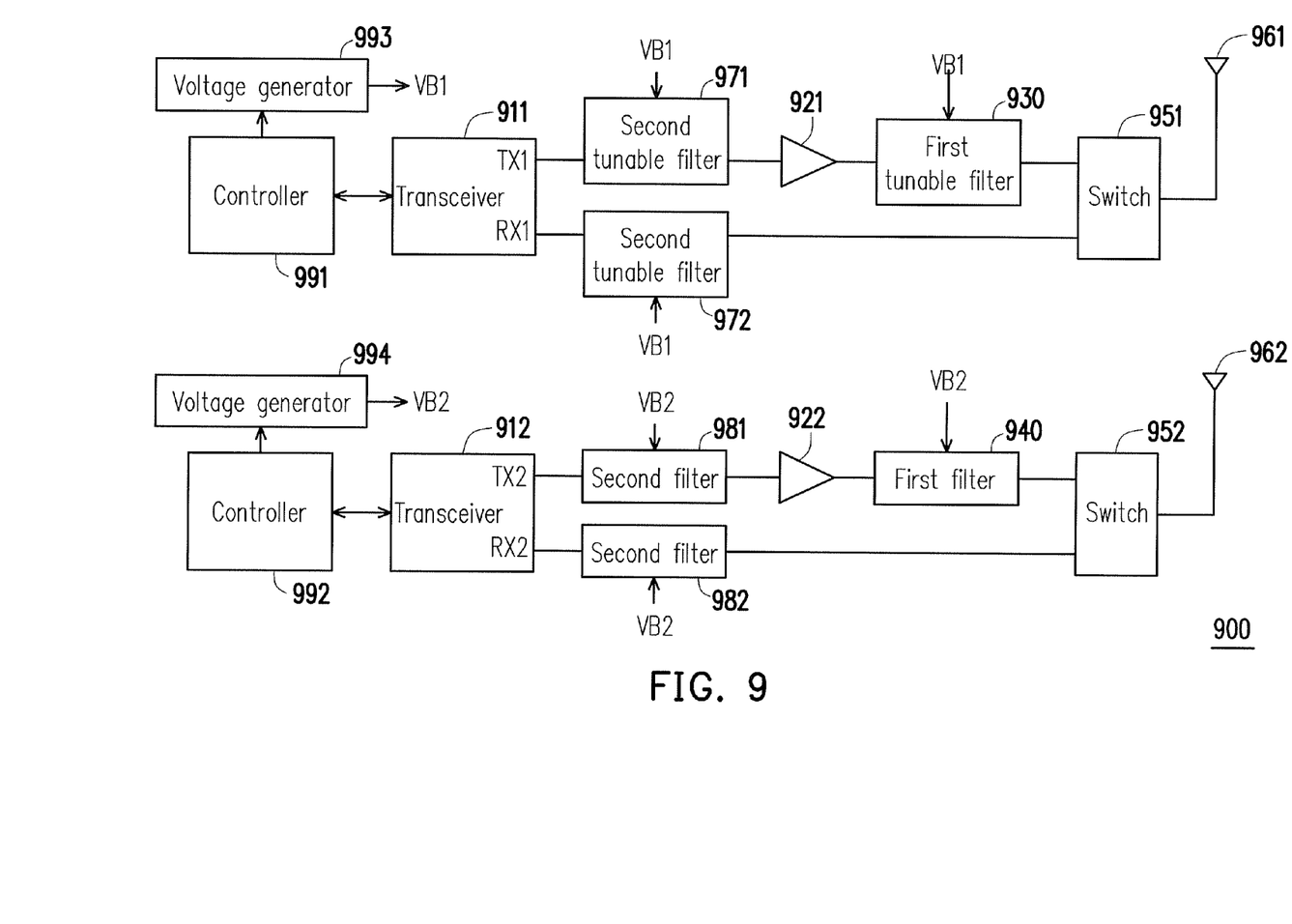
FIG. 9 is a schematic block view illustrating a wireless communication device according to an embodiment of the invention.

For example, FIG. 9 is a schematic block view illustrating a wireless communication device according to an embodiment of the invention. As shown in FIG. 9, a wireless communication device 900 includes transceivers 911 and 912, power amplifiers 921 and 922, a first tunable filter 930, a first filter 940, switches 951 and 952, antennas 961 and 962, second tunable filters 971 and 972, second filters 981 and 982, controllers 991 and 992, and voltage generators 993 and 994.

The transceivers 911 and 912 respectively include at least one signal end. For instance, signal ends of the transceiver 911 includes an transmitting end TX1 and a receiving end RX1, and the transceiver 911 may be electrically coupled to the antenna 961 through the transmitting end TX1 or the receiving end RX1. Likewise, signal ends of the transceiver 912 includes an transmitting end TX2 and a receiving end RX2, and the transceiver 912 may be electrically coupled to the antenna 962 through the transmitting end TX2 or the receiving end RX2. In another embodiment, the transceivers 911 and 912 respectively may include a plurality of transmitting ends and a plurality of receiving ends, and may be equipped with a plurality of switches for the plurality of transmitting ends and receiving ends to be coupled to a plurality of antennas, such that the transceivers 911 and 912 have a multiple-input multiple-output (MIMO) transmission mechanism to increase data transmission speed.

In terms of the transceiver 911, the switch 951 has a first end connected to the antenna 961, a second end coupled to the receiving end RX1 through the second tunable filter 972, and a third end. The power amplifier 921, the first tunable filter 930 and the second tunable filter 971 are connected in series between the transmitting end TX1 and the third end of the switch 951, and the power amplifier 921 is disposed between the first tunable filter 930 and the second tunable filter 971. The transceiver 911 may use a control signal to control the switch 951 such that the first end of the switch 951 is conducted to the second end or the third end of the switch 951. In other words, the switch 951 may conduct the antenna 961 to the first tunable filter 930 or the second tunable filter 972 such that the wireless communication device 900 may transmit or receive a radio frequency signal through the antenna 961.

In terms of the transceiver 912, the switch 952 has a first end connected to the antenna 962, a second end coupled to the receiving end RX2 through the second filter 982, and a third end. The power amplifier 922, the first filter 940 and the second filter 981 are connected in series between the transmitting end TX2 and the third end of the switch 952, and the power amplifier 922 is disposed between the first filter 940 and the second filter 981. The transceiver 912 may use a control signal to control the switch 952 such that the first end of the switch 952 is conducted to the second end or the third end of the switch 952. In other words, the switch 952 may conduct the antenna 962 to the first filter 940 or the second filter 982 such that the wireless communication device 900 may transmit or receive the radio frequency signal through the antenna 962.

It should be noted that the circuit structures of the second tunable filters 971 and 972 are identical as the circuit structure of the first tunable filter 930, and the first tunable filter 930 may be, for example, a low-pass tunable filter as described by FIG. 1 or 7. Moreover, the circuit structures of the second filters 981 and 982 are identical as the circuit structure of the first filter 940, and the first filter 940 may be, for example, a high-pass tunable filter as described by FIG. 4 or 8. The controller 991 and 992 respectively may generate a control signal. The voltage generator 993 may generate a bias voltage VB1 according to the control signal from the controller 991 so as to switch the first tunable filter 930 and the second tunable filters 971 and 972 to a first mode or a second mode. The voltage generator 994 may generate a bias voltage VB2 according to the control signal from the controller 992 so as to switch the first filter 940 and the second filters 981 and 982 to the first mode or the second mode. The first mode may be, for example, a concurrent dual-radio mode, and the second mode may be, for example, a non-concurrent dual-radio mode.

For example, the first tunable filter 930 may be, for example, the low-pass tunable filter 100 as described by FIG. 1, and the first filter 940 may be, for example, the high-pass tunable filter 400 as described by FIG. 4. In this case, when the bias voltages VB1 and VB2 are adjusted to a predetermined level (e.g., 0 volts), the first tunable filter 930 and the first filter 940 are switched to the first mode (i.e., the concurrent dual-radio mode). Under the first mode, as shown by FIGS. 2 and 5, the first tunable filter 930 includes the pass band (i.e., UNII-1 band) and the stop band (i.e., UNII-3 band), and the first filter 940 includes the pass band (i.e., UNII-3 band) and the stop band (i.e., UNII-1 band).

In other words, under the first mode, the pass band of the first tunable filter 930 is overlapped with the stop band of the first filter 940, and the stop band of the first tunable filter 930 is overlapped with the pass band of the first filter 940. Accordingly, the first tunable filter 930 is configured to pass a first radio frequency signal, and the first filter 940 is configured to pass a second radio frequency signal in the two pass bands (e.g., UNII-1 band and UNII-3 band) of the first tunable filter 930 and the first filter 940 thereby avoiding mutual interference between the two adjacent pass bands (e.g., UNII-1 band and UNII-3 band), where the wireless communication device 900 may perform the concurrent dual-radio operation.

Furthermore, when the bias voltages VB1 and VB2 are respectively adjusted to a non-zero voltage through the voltage generators 993 and 994, the first tunable filter 930 and the first filter 940 are switched to the second mode (i.e., the non-concurrent dual-radio mode). Under the second mode, the transceiver 912 may be disabled, and the bandwidth of the pass band of the first tunable filter 930 may increase in response to the increase in the bias voltage VB1, such that the pass band of the first tunable filter 930 may cover more bands, for example, the pass band of the first filter 940. Accordingly, the first tunable filter 930 is configured to pass the first radio frequency signal and the second radio frequency signal in the pass band of the first tunable filter 930. Moreover, under the second mode, the wireless communication device 900 may use the bias voltage VB1 to select a desired pass band and a desired stop band of the first tunable filter 930. Accordingly, an operating band of the wireless communication device 900 may be increased, thereby increasing the applicability of the wireless communication device 900.

Figure 10:
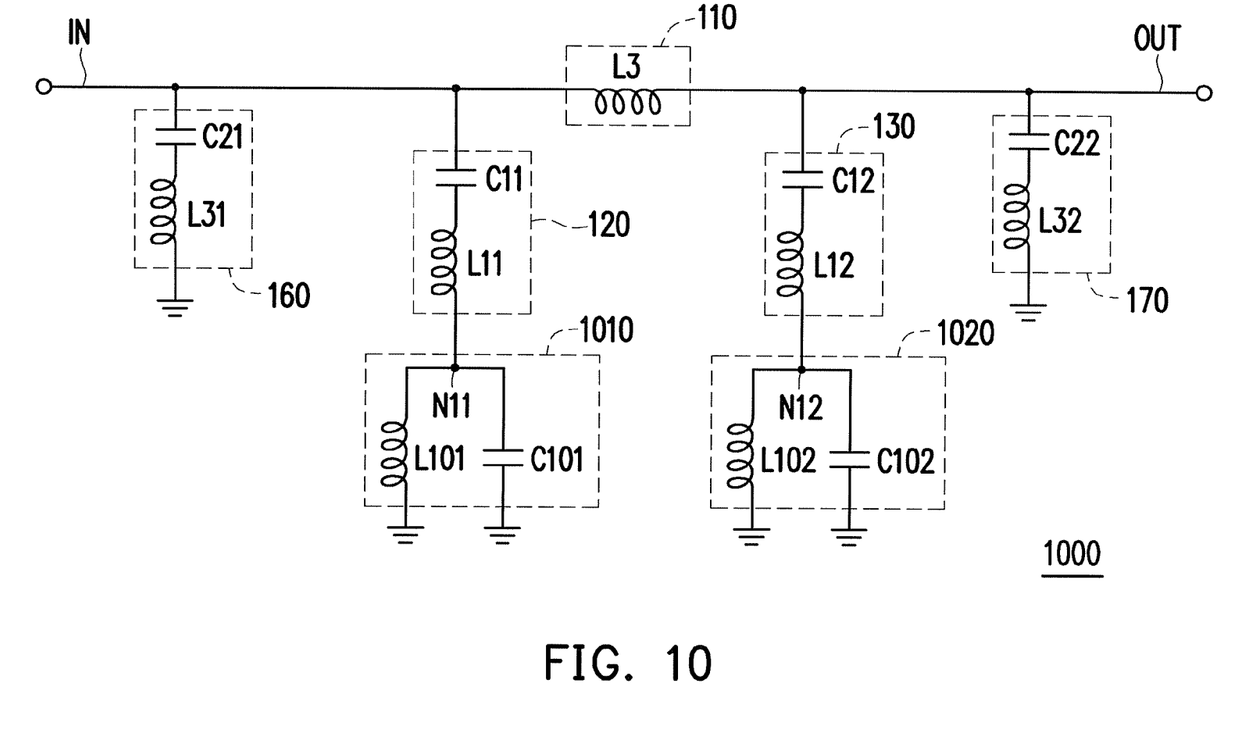
FIG. 10 is a schematic view illustrating a circuit of a non-tunable filter according to an embodiment of the invention.

It should be noted that the variable capacitors described by FIGS. 1, 4, 7 and 8 may be replaced as a fixed capacitor, respectively, and the fixed capacitor and an inductor may be connected in parallel between the connection node and the ground, so as to form a non-tunable filter. For example, FIG. 10 is a schematic view illustrating a circuit of a non-tunable filter according to an embodiment of the invention. Similarly to the embodiment of FIG. 1, a non-tunable filter 1000 in FIG. 10 includes the energy storage element 110, the series resonant circuits 120 and 130, and the series resonant circuits 160 and 170. Meanwhile, the non-tunable filter 1000 further includes a parallel resonant circuit 1010 and a parallel resonant circuit 1020.

The parallel resonant circuit 1010 includes a capacitor C101 and an inductor L101 that are connected in parallel between the connection node N11 and the ground. The parallel resonant circuit 1020 includes a capacitor C102 and an inductor L102 that are connected in parallel between the connection node N12 and the ground. Accordingly, the energy storage element 110, the series resonant circuits 120 and 130 as well as the parallel resonant circuits 1010 and 1020 may form a 5-order low-pass filter, and the series resonant circuits 160 and 170 are configured to increase another filter band to filter second order harmonic distortion.

Figure 11:
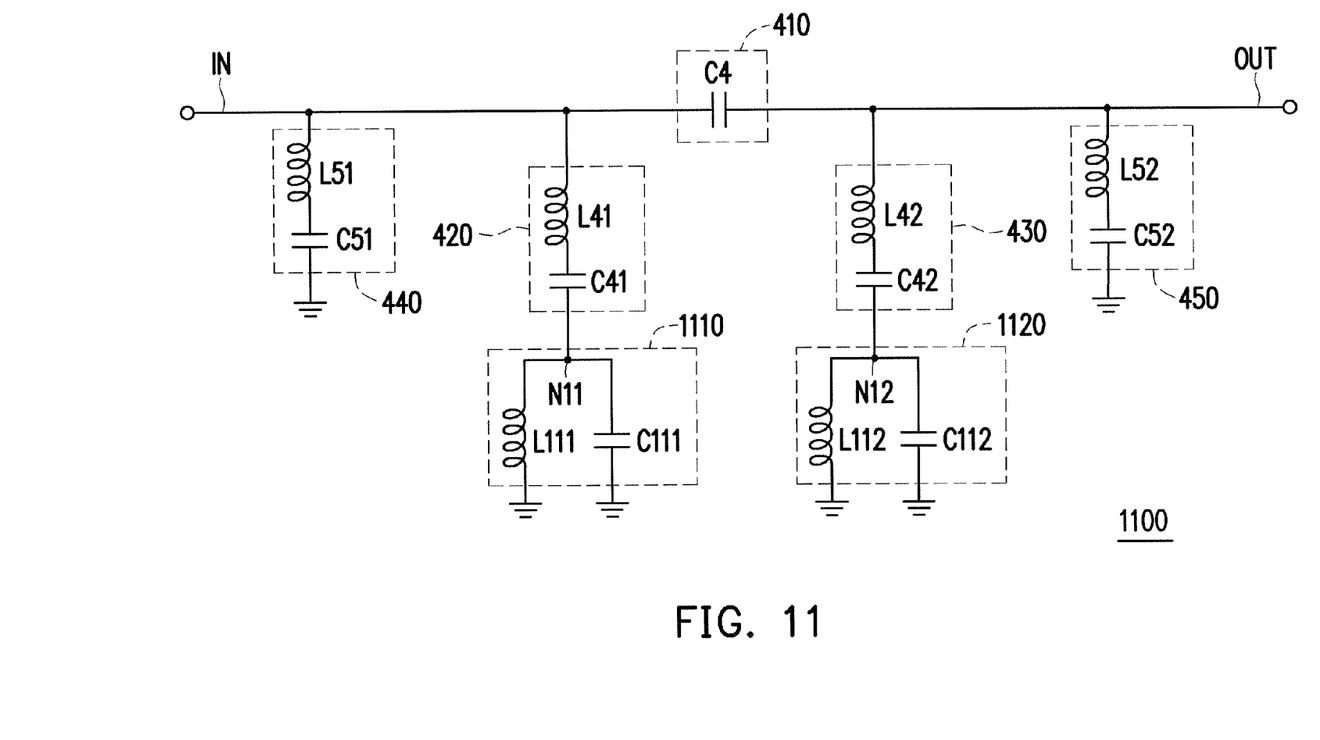
FIG. 11 is a schematic view illustrating a circuit of a non-tunable filter according to another embodiment of the invention.

FIG. 11 is a schematic view illustrating a circuit of a non-tunable filter according to another embodiment of the invention. Similarly to the embodiment of FIG. 4, a non-tunable filter 1100 in FIG. 11 includes the energy storage element 410, the series resonant circuits 420 and 430, and the series resonant circuits 440 and 450. Meanwhile, the non-tunable filter 1100 further includes a parallel resonant circuit 1110 and a parallel resonant circuit 1120. The parallel resonant circuit 1110 includes a capacitor C111 and an inductor L111 that are connected in parallel between the connection node N11 and the ground. The parallel resonant circuit 1120 includes a capacitor C112 and an inductor L112 that are connected in parallel between the connection node N12 and the ground. Accordingly, the energy storage element 410, the series resonant circuits 420 and 430 as well as the parallel resonant circuits 1110 and 1120 may a 5-order high-pass filter, and the series resonant circuits 440 and 450 are configured to increase another filter band to filter second order harmonic distortion.

Although the embodiment described by FIG. 9 exemplifies the structure of the wireless communication device 900, it should not be construed as a limitation to the invention. For example, the first filter 940 and the second filters 981 and 982 may respectively be a non-tunable filter (e.g., the non-tunable filter 1000 or 1100), and the controller 992 and the voltage generator 994 can be removed from the wireless communication device 900. Specifically, in an embodiment, the first tunable filter 930 and the second tunable filters 971 and 972 may respectively be the low-pass tunable filter as described by FIG. 1, the first filter 940 and the second filters 981 and 982 may respectively be the non-tunable filter 1100 as described by FIG. 11, and the controller 992 and the voltage generator 994 can be removed from the wireless communication device 900. In another embodiment, the first tunable filter 930 and the second tunable filters 971 and 972 may respectively be the high-pass tunable filter as described by FIG. 4, the first filter 940 and the second filters 981 and 982 may respectively be the non-tunable filter 1000 as described by FIG. 10, and the controller 992 and the voltage generator 994 can be removed from the wireless communication device 900.

In another embodiment, the first tunable filter 930 may be disposed in the transmitting path of the transceiver 911, the first filter 940 may be disposed in the transmitting path of the transceiver 912, and the second tunable filter 971 and the second filter 981 may be removed from the wireless communication device 900. In this case, the wireless communication device 900 may use the first tunable filter 930 to filter the noises from the transceiver 911 and the amplifier 921, and the wireless communication device 900 may use the first filter 940 to filter the noises from the transceiver 912 and the amplifier 922. In addition, when more filters are disposed in the transmitting paths and the receiving paths of the transceivers 911 and 912, the communication quality of the wireless communication device 900 may be further improved. For example, in the embodiment illustrated by FIG. 9, the wireless communication device 900 may further attenuate more wireless interference (e.g. co-channel interference, adjacent-channel interference) through the second tunable filters 971 and 972 and the second filters 981 and 982 so as to improve the communication quality of the wireless communication device 900.

As described above, in the invention, the tunable filter is formed in the manner that both ends of the energy storage element are respectively connected in cascade with a series resonant circuit and a tunable parallel resonant circuit. The tunable filter has sufficient attenuation without increasing orders, thereby reducing the manufacturing cost of the wireless communication device and facilitating minimization of the wireless communication device. Furthermore, the frequency response of the tunable filter may be changed by adjusting the bias voltage. In other words, an operating band of the wireless communication device may be adjusted through the bias voltage, thereby increase the applicability of the wireless communication device.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A tunable filter having an input end and an output end, comprising:
    a first energy storage element, electrically connected between the input end and the output end;
    a first series resonant circuit and a second series resonant circuit, wherein each of the first series resonant circuit and the second series resonant circuit comprises a first capacitor and a first inductor electrically connected in series; and
    a first tunable parallel resonant circuit and a second tunable parallel resonant circuit, wherein each of the first tunable parallel resonant circuit and the second tunable parallel resonant circuit comprises a variable capacitor and a second inductor electrically connected between a ground and a bias voltage, a connection node is located between the variable capacitor and the second inductor, and one end of the second inductor is configured to receive the bias voltage for adjusting a capacitance of the variable capacitor,
    wherein the first series resonant circuit is electrically connected between a first end of the first energy storage element and the connection node of the first tunable parallel resonant circuit, and the second series resonant circuit is electrically connected between a second end of the first energy storage element and the connection node of the second tunable parallel resonant circuit.

2. The tunable filter according to claim 1, wherein the first energy storage element is a third inductor, a first end of the third inductor is electrically connected to the input end and the first capacitor of the first series resonant circuit, and a second end of the third inductor is electrically connected to the output end and the first capacitor of the second series resonant circuit.

3. The tunable filter according to claim 2, wherein the first inductor of the first series resonant circuit is electrically connected to the connection node of the first tunable parallel resonant circuit, and the first inductor of the second series resonant circuit is electrically connected to the connection node of the second tunable parallel resonant circuit.

4. The tunable filter according to claim 1, wherein the first energy storage element is a second capacitor, a first end of the second capacitor is electrically connected to the input end and the first inductor of the first series resonant circuit, and a second end of the second capacitor is electrically connected to the output end and the first inductor of the second series resonant circuit.

5. The tunable filter according to claim 4, wherein the first capacitor of the first series resonant circuit is electrically connected to the connection node of the first tunable parallel resonant circuit, and the first capacitor of the second series resonant circuit is electrically connected to the connection node of the second tunable parallel resonant circuit.

6. The tunable filter according to claim 1, further comprising:
    a second energy storage element, having a first end electrically connected to the first energy storage element and a second end electrically connected to the input end or the output end;
    a third series resonant circuit; and
    a third tunable parallel resonant circuit, wherein the third series resonant circuit is electrically connected between the second end of the second energy storage element and the third tunable parallel resonant circuit.

7. The tunable filter according to claim 1, further comprising:
    a third series resonant circuit, electrically connected to the input end; and
    a fourth series resonant circuit, electrically connected to the output end, wherein the tunable filter filters a signal in a filter band through the third series resonant circuit and the fourth series resonant circuit.

8. The tunable filter according to claim 7, wherein the third series resonant circuit and the fourth series resonant circuit respectively comprise an inductor and a capacitor.

9. A wireless communication device, comprising:
    a first transceiver, electrically coupled to a first antenna;
    a second transceiver, electrically coupled to a second antenna;
    a first tunable filter, disposed between the first transceiver and the first antenna; and
    a first filter, disposed between the second transceiver and the second antenna, wherein the first tunable filter has an input end and an output end and comprises:
        a first energy storage element, electrically connected between the input end and the output end of the first tunable filter;
        a first series resonant circuit and a second series resonant circuit, wherein each of the first series resonant circuit and the second series resonant circuit comprises a first capacitor and a first inductor electrically connected in series; and
        a first tunable parallel resonant circuit and a second tunable parallel resonant circuit, wherein each of the first tunable parallel resonant circuit and the second tunable parallel resonant circuit comprises a first variable capacitor and a second inductor electrically connected between a ground and a first bias voltage, a connection node is located between the first variable capacitor and the second inductor, and one end of the second inductor is configured to receive the bias voltage for adjusting a capacitance of the first variable capacitor,
        wherein the first series resonant circuit is electrically connected between a first end of the first energy storage element and the connection node of the first tunable parallel resonant circuit, and the second series resonant circuit is electrically connected between a second end of the first energy storage element and the connection node of the second tunable parallel resonant circuit.

10. The wireless communication device according to claim 9, further comprising:
    a first controller, generating a control signal; and
    a first voltage generator, generating the first bias voltage according to the control signal to select the first tunable filter to a first mode or a second mode, wherein when the first tunable filter is selected to the first mode, a pass band of the first tunable filter is overlapped with a stop band of the first filter, a stop band of the first tunable filter is overlapped with a pass band of the first filter, and the first tunable filter is configured to pass a first radio frequency signal, and the first filter is configured to pass a second radio frequency signal.

11. The wireless communication device according to claim 10, wherein when the first tunable filter is selected to the second mode, the first tunable filter is configured to pass the first radio frequency signal and the second radio frequency signal.

12. The wireless communication device according to claim 9, wherein the first transceiver comprises a first transmitting end and a first receiving end, and the wireless communication device further comprises:
   a first switch, electrically connected between the first antenna and the first tunable filter; and
   a first power amplifier, wherein the first power amplifier and the first tunable filter are electrically coupled in series between the first transmitting end and the first switch.

13. The wireless communication device according to claim 12, further comprising:
   a second tunable filter, having a circuit structure identical to that of the first tunable filter, and disposed between the first receiving end and the first switch.

14. The wireless communication device according to claim 13, wherein the second transceiver comprises a second transmitting end and a second receiving end, and the wireless communication device further comprises:
   a second switch, electrically between the second antenna and the first filter; and
   a second power amplifier, wherein the second power amplifier and the first filter are electrically coupled in series between the second transmitting end and the second switch.

15. The wireless communication device according to claim 14, further comprising:
   a second filter, having a circuit structure identical to that of the first filter, and disposed between the second receiving end and the second switch.

16. The wireless communication device according to claim 9, wherein the first energy storage element is a third inductor, a first end of the third inductor is electrically connected to the input end of the first tunable filter and the first capacitor of the first series resonant circuit, a second end of the third inductor is electrically connected to the output end of the first tunable filter and the first capacitor of the second series resonant circuit, the first inductor of the first series resonant circuit is electrically connected to the connection node of the first tunable parallel resonant circuit, and the first inductor of the second series resonant circuit is electrically connected to the connection node of the second tunable parallel resonant circuit.

17. The wireless communication device according to claim 16, wherein the first filter comprises:
   a second capacitor, electrically connected between an input end and an output end of the second tunable filter;
   a fourth inductor and a third capacitor, electrically connected in series, and the fourth inductor being electrically connected to a first end of the second capacitor;
   a fifth inductor and a fourth capacitor, electrically connected in series, and the fifth inductor being electrically connected to a second end of the second capacitor;
   a sixth inductor and a second variable capacitor, electrically connected between a second bias voltage and the ground, and the third capacitor being electrically connected to a connection node between the sixth inductor and the second variable capacitor; and
   a seventh inductor and a third variable capacitor, electrically connected between the second bias voltage and the ground, and the fourth capacitor being electrically connected to a connection node between the seventh inductor and the third variable capacitor.

18. The wireless communication device according to claim 16, wherein the first filter comprises:
   a second capacitor, electrically connected between an input end and an output end of the non-tunable filter;
   a fourth inductor and a third capacitor, electrically connected in series, and the fourth inductor being electrically connected to a first end of the second capacitor;
   a fifth inductor and a fourth capacitor, electrically connected in series, and the fifth inductor being electrically connected to a second end of the second capacitor;
   a sixth inductor and a fifth capacitor, electrically connected in parallel between the third capacitor and the ground; and
   a seventh inductor and a sixth capacitor, electrically connected in parallel between the fourth capacitor and the ground.

19. The wireless communication device according to claim 9, wherein the first energy storage element is a second capacitor, a first end of the second capacitor is electrically connected to the input end of the first tunable filter and the first inductor of the first series resonant circuit, a second end of the second capacitor is electrically connected to the output end of the first tunable filter and the first inductor of the second series resonant circuit, the first capacitor of the first series resonant circuit is electrically connected to the connection node of the first tunable parallel resonant circuit, and the first capacitor of the second series resonant circuit is electrically connected to the connection node of the second tunable parallel resonant circuit.

20. The wireless communication device according to claim 19, wherein the first filter comprises:
   a third inductor, electrically connected between an input end and an output end of the non-tunable filter;
   a third capacitor and a fourth inductor, electrically connected in series, and the third capacitor being electrically connected to a first end of the third inductor;
   a fourth capacitor and a fifth inductor, electrically connected in series, and the fourth capacitor being electrically connected to a second end of the third inductor;
   a sixth inductor and a fifth capacitor, electrically connected in parallel between the fourth inductor and the ground; and
   a seventh inductor and a sixth capacitor, electrically connected in parallel between the fifth inductor and the ground.

\* \* \* \* \*